United States Patent [19]

Ushiyama et al.

[11] Patent Number: 5,394,290

[45] Date of Patent: * Feb. 28, 1995

[54] ACTIVE TUNED MAGNETIC FLUX RATE FEEDBACK SENSING ARRANGEMENT

[75] Inventors: Randall K. Ushiyama, Torrance, Calif.; Michael K. Scruggs, Pompton Plains, N.J.; Eric C. Mathisen, Brooklyn, N.Y.; Eric Hahn, Woodcliff Lake, N.J.

[73] Assignee: AlliedSignal Inc., Morris Township, Morris County, N.J.

[*] Notice: The portion of the term of this patent subsequent to Jul. 12, 2011 has been disclaimed.

[21] Appl. No.: 85,785

[22] Filed: Jul. 6, 1993

[51] Int. Cl.$^6$ .......................................... G01R 33/02
[52] U.S. Cl. ................. 361/146; 324/207.17; 324/207.12; 324/260
[58] Field of Search .............. 361/139, 143, 146, 147, 361/148; 324/207.12, 207.16, 207.17, 207.26, 225, 233, 239, 258, 259, 260; 318/128, 460, 623, 632, 652, 653; 310/51

[56] References Cited

U.S. PATENT DOCUMENTS

| | | | |
|---|---|---|---|
| 4,810,964 | 3/1989 | Granberg et al. | 324/207 |
| 5,013,987 | 5/1991 | Wakui | 318/632 |
| 5,066,911 | 11/1991 | Hulsing, II | 324/207.12 |
| 5,107,210 | 4/1992 | Shirao et al. | 324/207.12 |

Primary Examiner—Jeffrey A. Gaffin
Attorney, Agent, or Firm—Howard G. Massung

[57] ABSTRACT

An arrangement using sensing coils for obtaining flux rate of change information in a magnetic circuit. The arrangement can be used for vibration attenuation in a magnetic forcer system. Active (electric powered) circuitry is used to implement closed loop control of flux rate. The control loop is "tuned" for attenuating a narrow range of vibration frequencies. The arrangement can be applied to magnetic forcer/suspension systems in which vibrations due to magnetic, mechanical/magnetic runouts, system mechanical resonances, or external vibration sources are present.

6 Claims, 3 Drawing Sheets

ACTIVE TUNED MAGNETIC FLUX RATE FEEDBACK SENSING ARRANGEMENT

CROSS REFERENCE TO RELATED APPLICATION

This application is related to commonly assigned U.S. Pat. No. 5,329,416 entitled Active Broadband Magnetic Flux Rate Feedback Sensing Arrangement which issued to the present inventors on Jul. 12, 1994.

BACKGROUND OF THE INVENTION

This invention relates to an arrangement for obtaining flux rate of change information in a magnetic circuit such as may be used for vibration attenuation in a magnetic forcer system.

Passive arrangements for the purpose described include spring/mass systems, mechanical dampers and hybrid visco-elastic devices. Active arrangements may be open or closed loop and may include forcer elements or drive elements such as piezoceramic elements, pneumatic/hydraulic drives, or electromagnetic devices which, when used in conjunction with appropriate sensing elements, can be used to actively accomplish the aforenoted vibration attenuation.

In an active open loop configuration, a command matching the vibration to be attenuated as a function of time is applied to the forcer element. This configuration works well when the vibration dynamics can be modeled accurately. Alternatively, an active closed loop arrangement can be employed, whereby the vibration is sensed and the sensed information is used to adjust a command matching the vibration.

The present invention is similar to the above described active closed loop arrangement which uses "Hall Effect" devices to measure magnetic flux within an air gap. These devices are operative so that presence of a magnetic field of a proper orientation induces a small voltage in a semiconductor device. The Hall Effect arrangement uses flux as the sensed parameter for vibration attenuation. The present invention, on the other hand, uses flux rate for this purpose.

Accordingly, it is the object of the present invention to use a closed loop or feedback arrangement for sensing flux rate of change in a magnetic circuit. In this regard, it is noted that in the present invention the closed loop is tuned whereby a narrow range of vibration frequencies are attenuated as may be desired. This is in contrast to the invention disclosed and claimed in the aforenoted U.S. Pat. No. 5,329,416 wherein the closed loop is broadband in that a broad range of vibration frequencies are attenuated as likewise may be desired.

SUMMARY OF THE INVENTION

This invention contemplates an active tuned magnetic flux rate feedback sensing arrangement wherein a magnetic circuit includes a sensor element and a forcer or drive element in the form of wound wire coils for providing a magnetic flux path. The sensor output is dictated by a command to the forcer element and provides a flux rate output.

A signal is induced in the sensor element due to the flux rate output. The signal is processed by conditioning electronics and a filter tuned to a narrow range of signal frequencies. The output of the tuned filter is fed back to the drive element loop to provide a closed loop configuration.

DETAILED DESCRIPTION OF THE INVENTION

Figure 1:
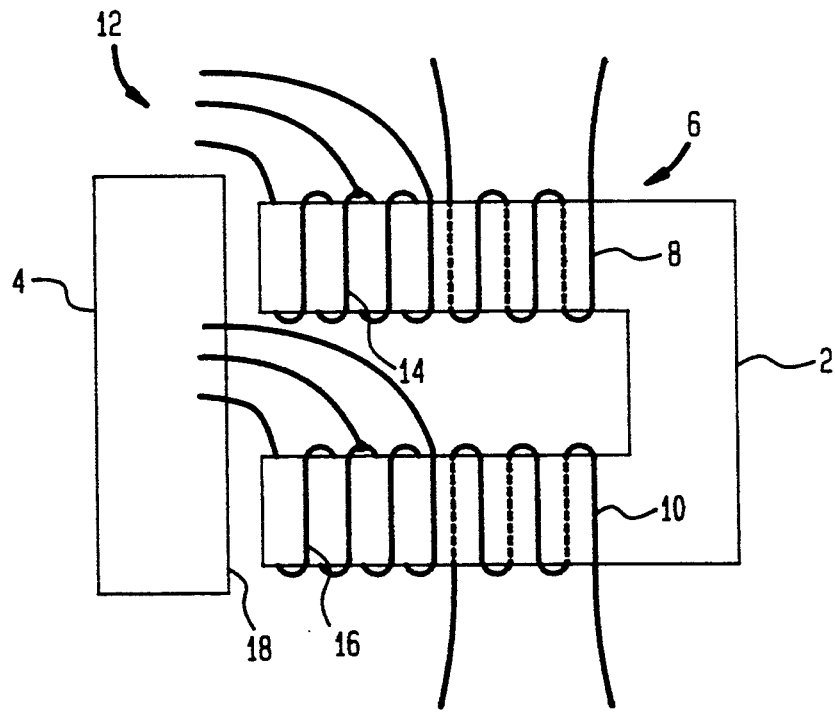
FIG. 1 is a diagrammatic representation illustrating a magnetic circuit according to the invention.

With reference first to FIG. 1, the orientation of a flux rate sensing coil in relation to a drive or forcer coil in a magnetic circuit is illustrated. Thus, a stator is designated by the numeral 2 and a rotor is designated by the numeral 4. Stator 2 carries a drive coil 6 having legs 8 and 10 and carries a sensor coil 12 having legs 14 and 16. The output of sensor coil 12 at legs 14 and 16 is equal to the number of sensor coil turns times the rate of change of magnetic flux.

Legs 14 and 16 of sensor coil 12 are disposed close to an air gap 18 between stator 2 and rotor 4. With this arrangement, magnetic flux induced in stator 2 moves from the stator to rotor 4 and then back to the stator with minimal pick-up of stray leakage magnetic flux fields in the magnetic circuit.

Figure 2:
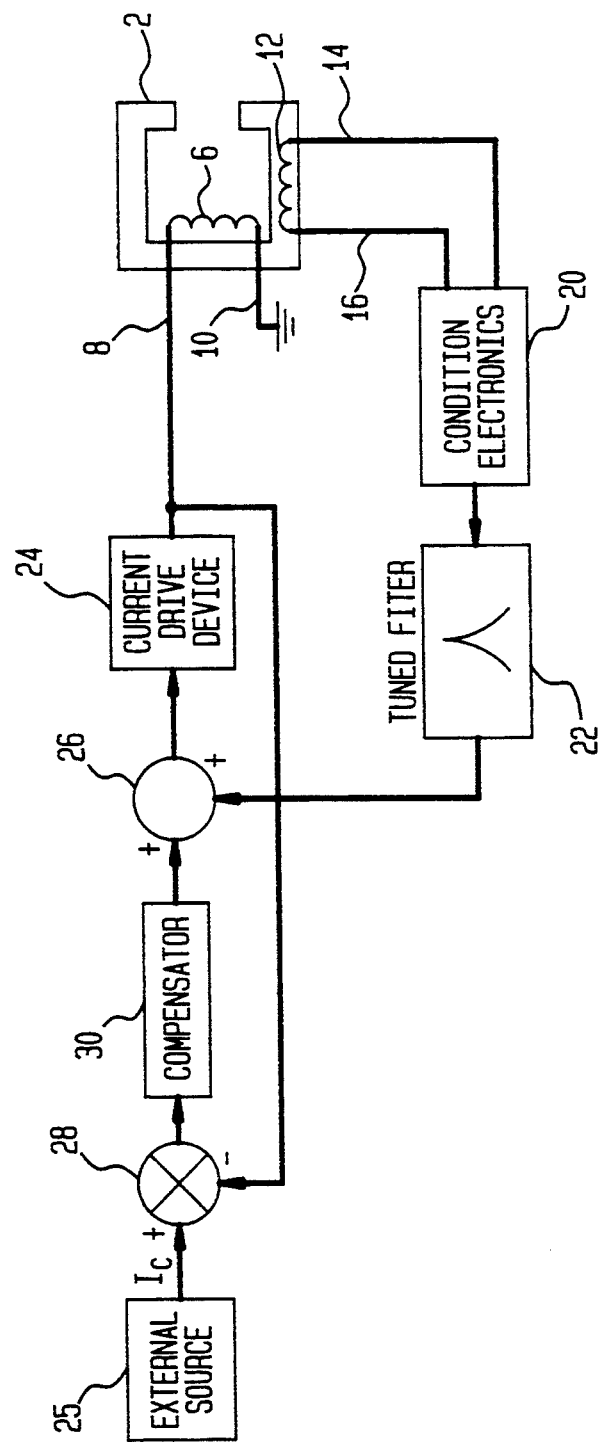
FIG. 2 is a block diagram illustrating an active tuned flux rate feedback sensing arrangement according to the invention.

With reference to FIG. 2, sensor coil legs 14 and 16 are connected to conditioning electronics 20. Conditioning electronics 20 provides a flux rate signal which is applied to a tuned filter 22 which passes a narrow range of signal frequencies.

The signal from tuned filter 22, is fed back as an input to a current drive device 24 via a summing device 26. An external source 25 provides a command signal $I_c$ which is applied to a summing device 28 and is summed thereby with the output from current drive device 24.

Summing device 28 sums the signal from current drive device 24 with command signal $I_c$ and provides a summed signal which is applied to a current forward loop compensator 30 and therefrom to summing device 26. Summing device 26 sums the signal from compensator 30 with the signal from tuned filter 22 and provides a summed signal which is applied to current drive device 24. Current drive device 24 provides a signal which is applied as current feedback to summing device 28 and is applied to drive coil 6 of stator 2 for energizing the drive coil.

With the arrangement described, a signal is induced in sensor coil 12 due to the rate of change of magnetic flux and is used in a tuned filter closed loop configuration. This signal is processed by conditioning electronics 20 and tuned filter 22. The processed signal is then fed back to a drive command loop including summing device 28, compensator 30 and summing means 26.

Figure 3:
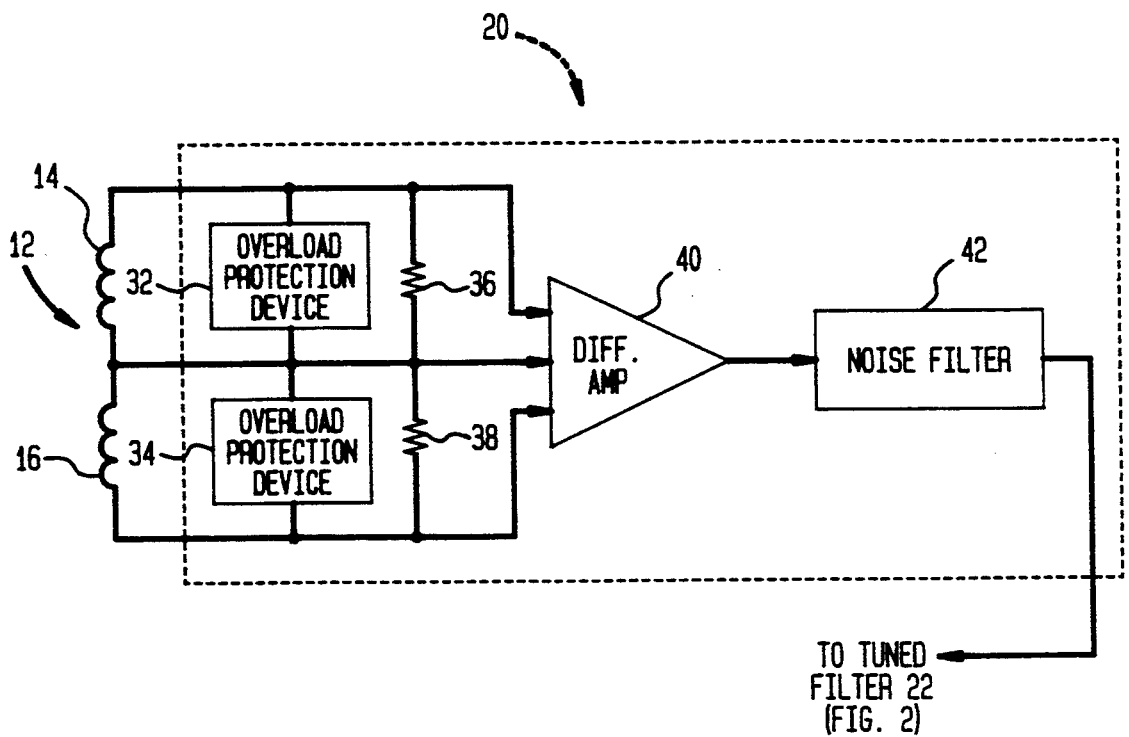
FIG. 3 is a circuit diagram more specifically illustrating conditioning electronics shown generally in FIG. 2.

The arrangement including conditioning electronics 20 shown generally in FIG. 2 is shown more specifically in FIG. 3 and includes overload protection devices 32 and 34, load resistors 36 and 38, a differential amplifier 40 and a noise filter 42.

Overload protection device 32 is connected across leg 14 of sensor coil 12 and overload protection device 34 is connected across leg 16 of the sensor coil. Overload protection devices 32 and 34 may be diodes. Load resistor 36 is connected across overload protection device 32 and load resistor 38 is connected across overload protection device 34. The signal from sensor coil 12 is applied through overload protection devices 32 and 34 and load resistors 36 and 38 to a differential amplifier 40 and therefrom through high frequency noise filter 42 which provides a filtered signal. The filtered signal is applied to tuned filter 22 as shown in FIG. 2. This arrangement is useful for preventing extraneous noise from interfering with the operation of the closed loop configuration heretofore described.

Differential amplifier 40 rejects common mode voltages that may be present due to IR drops, or other non-linear effects. Load resistors 36 and 38 are selected in conjunction with overload protection devices 32 and 34, respectively, to limit peak loads. Since the induced voltage is proportional to the rate Of change of flux or the rate of change of current in drive coil 6, for high $D_i/D_t$ systems, overvoltage protection as described is mandatory.

Figure 4:
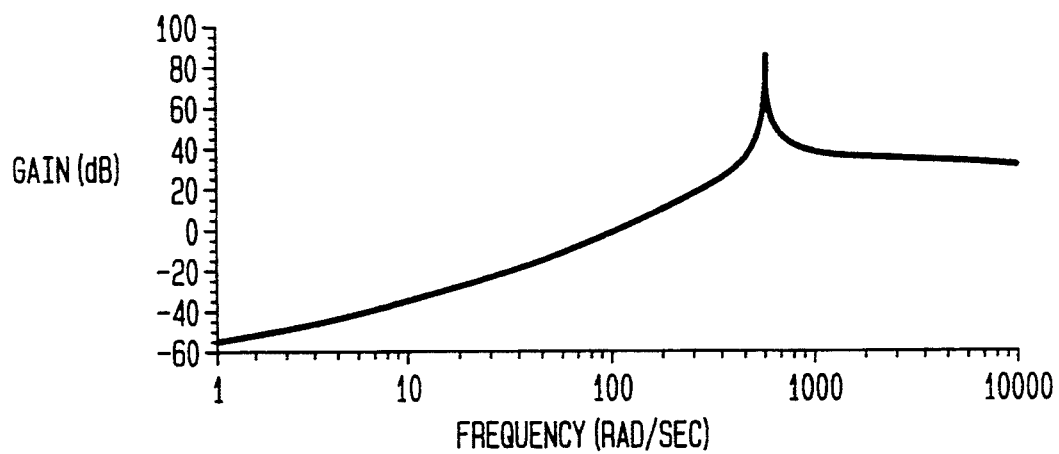
FIG. 4 is a graphical representation illustrating a typical frequency response resulting from the implementation of the invention illustrated in FIGS. 1–3.
Figure 5:
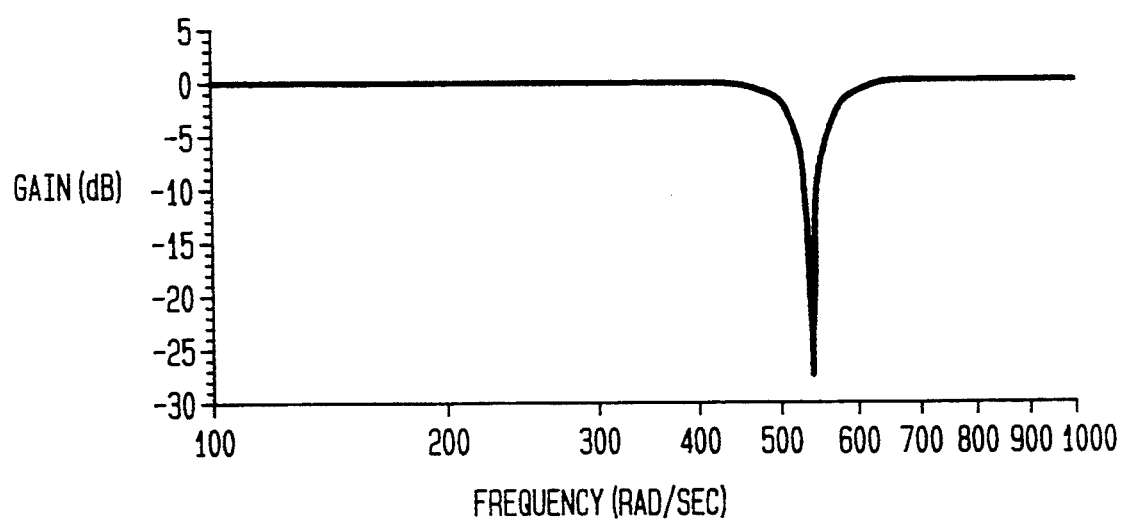
FIG. 5 is a graphical representation illustrating vibration attenuation at particular frequencies as accomplished by the implementation of the invention illustrated in FIGS. 1–3.

FIG. 4 shows a typical frequency response plot of tuned filter 22. The gain or authority is low at low frequencies (where the sensor coil output is low) and is particularly high for a narrow band of frequencies of higher frequencies. This arrangement results in good vibration attenuation at a particular frequency as shown in FIG. 5. At lower frequencies, the current loop (FIG. 2) has authority.

It will now be appreciated that flux rate feedback using sensing coils as in the present invention provides superior vibration attenuation compared to prior art Hall Effect devices at frequencies greater than zero. In this regard, it will be noted that the voltage obtained from a Hall Effect device is typically small and must be amplified with a high gain device. This makes such an arrangement susceptible to noise which is obviated by the present invention. In further contrast to the prior art Hall Effect devices, said devices are typically limited to a temperature range less than ninety to one hundred and twenty degrees Celsius. Further, the Hall Effect devices require both temperature correction and calibration for non-linear effects and a precision current source is required. The present invention obviates these requirements while providing a flux rate sensor which is relatively simple and does not require calibration.

With the above description of the invention in mind, reference is made to the claims appended hereto for a definition of the scope of the invention.

What is claimed is:

1. An active tuned magnetic flux rate feedback sensing arrangement, comprising:
   a magnetic circuit including a rotor and a stator, the stator carrying a drive coil and a sensor coil;
   the rotor and the stator cooperatively arranged so that a signal is induced in the sensor coil and the sensor coil provides a signal proportional to the rate of change of flux in the magnetic circuit;
   means connected to the sensor coil for processing the flux rate of change signal therefrom and for providing a processed flux rate of change signal;
   means for providing a command signal;
   means for providing a signal for energizing the drive coil;
   means for combining the command signal and the signal for energizing the drive coil and for providing a first combined signal;
   means connected to the means for providing the first combined signal for applying current compensation to said first combined signal and for providing a compensated signal;
   means for combining the compensated signal and the processed flux rate of change signal and for providing a second combined signal; and
   the means for providing a signal for energizing the drive coil connected to the means for providing the second combined signal and responsive to said second combined signal for providing said signal for energizing the drive coil.

2. An arrangement as described by claim 1, wherein the processing means includes:
   conditioning means connected to the sensor coil for inhibiting the affect of noise on the signal provided by the sensor coil, and for providing an inhibited signal; and
   tuned filter means connected to the conditioning means, said tuned filter means tuned to a narrow range of frequencies of the signal provided by the sensor coil for passing signals within said narrow range of frequencies.

3. An arrangement as described by claim 2, wherein the conditioning means includes:
   overload protection means connected to the sensor coil;
   means connected to the overload protection means for rejecting common mode components in the signal from the sensor coil; and
   filter means connected to the common mode component rejection means for filtering the signal therefrom and for providing the inhibited signal.

4. A method for sensing flux rate of change in a magnetic circuit comprising:
   supporting a drive coil and a sensor coil on a stator;
   arranging the stator and a rotor in a magnetic circuit for inducing a signal in the sensor coil which is proportional to the rate of change of flux in the magnetic circuit;
   processing the flux rate of change signal;
   providing a command signal;
   providing a signal for energizing the drive coil;
   combining the command signal and the energizing signal;
   applying current compensation to the combined command and energizing signal; and
   combining the current compensated signal and the processed flux rate signal for providing the signal for energizing the drive coil.

5. A method as described by claim 4, including:
   conditioning the flux rate of change signal for inhibiting the effects of noise on said signal; and
   filtering the conditioned signal for passing conditioned signals within a narrow range of frequencies.

6. A method as described by claim 5, including:
   protecting the sensor coil from overload conditions;
   rejecting common mode components in the sensor coil signal; and
   filtering the sensor coil signal with the rejected common mode components for inhibiting the effects of noise on said signal.

* * * * *